(12) United States Patent
Rohde et al.

(10) Patent No.: US 7,580,693 B2
(45) Date of Patent: Aug. 25, 2009

(54) PASSIVE REFLECTION MIXER

(75) Inventors: Ulrich L. Rohde, Upper Saddle River, NJ (US); Antonio Almeida, Clark, NJ (US); Ajay Kumar Poddar, Fairlawn, NJ (US); Vaseem Ahmed, Hasbrouck Heights, NJ (US); Nikolay Ilkov, Teltow (DE); Klaus Juergen Schoepf, Ringwood, NJ (US)

(73) Assignee: Synergy Microwave Corporation, Paterson, NJ (US)

( * ) Notice: Subject to any disclaimer, the term of this patent is extended or adjusted under 35 U.S.C. 154(b) by 465 days.

(21) Appl. No.: 11/259,766

(22) Filed: Oct. 27, 2005

(65) Prior Publication Data

US 2006/0141976 A1 Jun. 29, 2006

Related U.S. Application Data

(60) Provisional application No. 60/622,485, filed on Oct. 27, 2004, provisional application No. 60/710,310, filed on Aug. 22, 2005.

(51) Int. Cl.
*H04B 1/26* (2006.01)
(52) U.S. Cl. .................. 455/326; 455/333; 455/319; 455/313; 455/323
(58) Field of Classification Search ............. 455/326, 455/333, 319, 313, 323
See application file for complete search history.

(56) References Cited

U.S. PATENT DOCUMENTS

| | | | |
|---|---|---|---|
| 3,700,928 A | 10/1972 | Milberger et al. | |
| 4,500,847 A | 2/1985 | Hallford | |
| 4,502,028 A | 2/1985 | Leake | |
| 4,675,911 A | 6/1987 | Sokolov et al. | |
| 4,979,233 A | 12/1990 | Kawahata et al. | |
| 5,027,163 A | 6/1991 | Dobrovolny | |
| 5,060,298 A * | 10/1991 | Waugh et al. | 455/326 |
| 5,130,678 A | 7/1992 | Edwards | |
| 5,280,648 A | 1/1994 | Dobrovolny | |
| 5,361,409 A | 11/1994 | Vice | |
| 5,416,449 A | 5/1995 | Joshi | |
| 5,428,839 A | 6/1995 | Friesen et al. | |
| 5,602,501 A | 2/1997 | Shiga et al. | |
| 5,732,345 A * | 3/1998 | Vice | 455/333 |
| 5,799,248 A | 8/1998 | Vice | |
| 5,963,858 A | 10/1999 | Seely | |
| 6,064,872 A * | 5/2000 | Vice | 455/326 |
| 6,144,236 A | 11/2000 | Vice et al. | |

(Continued)

FOREIGN PATENT DOCUMENTS

WO -WO 97/23033 6/1997

OTHER PUBLICATIONS

Steven A. Mass in the IEEE Transactions on Microwave Theory Techniques, "A GaAs MESFET Mixer With Very Low Intermodulation," MTT-S Digest, 1987, pp. 89-898.

(Continued)

*Primary Examiner*—Sanh D Phu
(74) *Attorney, Agent, or Firm*—Lerner, David, Littenberg, Krumholz & Mentlik, LLP

(57) ABSTRACT

In one aspect, a mixer that provides improved isolation between an input oscillator and a mixing cell. In another aspect, a mixer that includes circuitry operative to shape an input signal provided by a local oscillator.

20 Claims, 12 Drawing Sheets

U.S. PATENT DOCUMENTS 6,850,575 B1    2/2005    Ahmed

OTHER PUBLICATIONS

Ed Oxner, "High Dynamic Range Mixing With the Si8901," Mar. 19888 issue of hr (ham radio).

S. Weiner et al. "2 to 8 GHZ Double Balanced MESFET Mixer with +30 dBm Input Third Order Intercept" published in the 1988 IEEE MTT-S Digest, pp. 1097-1099.

Pavio, A.M. et al., "Double Balanced Mixers Using Active and Passive Techniques," IEEE Transactions on Microwave Theory Techniques, MTT-36, 1988 pp. 1948-1956.

* cited by examiner

PASSIVE REFLECTION MIXER

CROSS-REFERENCE TO RELATED APPLICATIONS

This application claims the benefit of the filing date of U.S. Provisional Patent Application Nos. 60/622,485 filed Oct. 27, 2004, and 60/710,310 filed Aug. 22, 2005, the disclosures of which are hereby incorporated herein by reference.

BACKGROUND OF THE INVENTION

The present invention generally relates to mixers. More particularly, the present invention relates to passive reflection mixers including single, double, and triple balanced mixers that employ one or more field effect transistors (FETs).

Mixers typically play an important role in radio frequency (RF) and microwave systems that employ frequency conversion. They are usually used to up-convert signal frequencies for transmission and down-convert received signals to lower intermediate frequencies (IF). Further in that regard, a mixer is generally considered a fundamental building block of a receiver.

Mixers may be broadly classified as either active type or passive type. The active mixer is frequently based upon the Gilbert-cell architecture, whereas the passive mixer is usually based upon a FET or diode ring. The active mixer approach typically yields low conversion loss or even gain, provides a good degree of balance, but often at the expense of modest linearity and the noise figure. On the other hand, the passive mixer is usually able to provide good linearity, but with typically 6 dB conversion loss and a need for high local oscillator (LO) drive levels.

The performance priorities of modern communication systems generally include stringent requirements for wide dynamic range, suppression of intermediation products, frequency stability and the effects of cross-modulation. These requirements must typically be carefully considered during the design of mixers.

In addition, due to crowding of the usable frequency spectrum and an increasing number of wireless applications, radio frequency receivers typically receive a growing number of unwanted signals at undesired carrier frequencies. The unwanted signals arrive at a receiver along with the information-bearing signal (i.e., the wanted signal) at the desired carrier frequency. When the unwanted signals are close in frequency to the carrier frequency of the information-bearing signal, a front-end receiver's filter typically cannot remove the unwanted interference signals. The unwanted signals then mix with each other and with the information bearing signals to generate intermodulation distortion (IMD). As such, minimization of the intermodulation (IM) products is typically an important goal.

Frequency conversion in mixers is generally regarded as being achieved through two different mechanisms. One mechanism is generally considered to have a non-linear characteristic, i.e., a square law characteristic, typically a diode V-I transfer characteristic or transistor transconductance characteristic. The other mechanism is generally considered to have a linear characteristic, i.e., time varying conductance, such as a switch pumped by a local oscillator (LO).

FETs generally exhibit a linear characteristic. In particular, a FET is generally considered linear based on the fact that a FET follows a square law characteristic (i.e., $I \propto V^2$) and therefore the first derivative, its transconductance, is expected to be constant. This is generally valid over a relatively wide amplitude range. FET mixers also typically require relatively low local oscillator power levels and provide isolation of the local oscillator signal relative to the radio and intermediate frequency signals. The overall performance characteristics of the FET double-balanced mixer have made it popular among available mixer types. Among its attributes are improved inter-port isolation and rejection of local-oscillator carrier amplitude modulation.

A FET mixer's intercept point is, however, subject to load-impedance variations, with a purely resistive termination typically providing the best case. Terminating the mixer with a filter is another possible approach to reducing load-impedance variations, but such a filter looks purely resistive only within its 3-dB pass-band; in the transition band and beyond, the filter impedance rises relatively rapidly and the mixer intercept point thereby degrades. Another approach is to configure the FET output as a high-pass filter, using capacitive coupling from the output tuned circuit to a 50-ohm band-pass filter. Outside its pass-band, this impedance inverter acts more like a short circuit and maintains IMD products at a reasonable level. The alternative to this is the popular diplexer, which requires more components and has more insertion loss.

An active FET mixer achieves gain at the expense of the intercept point; the difference can be as much as 20 dB. On the other hand, one can use any FET as a passive device by switching the source-drain channel ON and OFF. This impedance modulation is somewhat similar to a diode mixer, but the gate electrode is isolated from both source and drain. It nonetheless falls in the category of additive mixers because there is sufficient interaction between gate and source, although the impedance at the gate changes significantly less than in an additive diode mixer. Implementation of these types of mixers is usually challenging. Furthermore, building a high-performance passive FET mixer requires a pair or quad of mixer cells that should be sufficiently matched to suppress even-order IMD products.

Dual-Gate MOSFET/GaAsFET devices significantly suppress second order IMD products. In that regard, GaAs MESFET transistors have become popular for applications that require wideband performance, high dynamic range, and low distortion with small levels of LO power. In general, the 1-dB compression point, which is a commonly used figure-of-merit measurement for linearity in a mixer, is typically several dB above the LO drive level (3 to 6 dB) for a GaAs MESFET mixer. In comparison, a Schottky diode mixer is typically several dB below the LO drive level (3 to 6 dB). Therefore, improvements in mixer performance are generally achieved when MESFET transistors replace Schottky diodes in high linearity, low distortion mixers.

For example, in an article by Stephen A. Mass, entitled "A GaAs MESFET Mixer With Very Low Intermodulation," IEEE Transactions on Microwave Theory Techniques, MTT-S Digest, 1987, pp. 895-898, one type of resistive mixer for high frequencies is described. The mixer is a balanced resistive type that uses the unbiased channel of a GaAs MESFET as the mixing element and operates at X-band frequencies.

Another article, by Ed Oxner, entitled "High Dynamic Range Mixing With the Si8901," March 1988 Issue Of Ham Radio (and similarly in Siliconix Application Note AN85-2), shows a double balanced commutation-type MOSFET mixer constructed in a bridge configuration with four MOSFETS. This mixer is limited to operation in the HF and low VHF region. This mixer suffers a disadvantage in requiring a large gate voltage in excess of +15 volts to achieve 77 dB of rejection of inter modulation distortion (IMD) products referred to the input signal. Furthermore, a negative supply is also necessary at the MOSFET substrates, adding to the need of dual polarity power supplies.

Reference may also be made to an article by S. Weiner et al., entitled "2 to 8 GHZ Double Balanced MESFET Mixer with +30 dBm Input Third Order Intercept," IEEE MTT-S Digest, 1988, pp. 1097-1099. This article describes a double balanced MESFET mixers operating in unbiased mode with +23 dBm LO drive level. Weiner's mixer typically has a third order input intercept ($IIP_3$) of +30 dBm. Further reference may be made to Pavio, A. M. et al., "Double Balanced Mixers Using Active and Passive Techniques," IEEE Transactions on Microwave Theory Techniques, MTT-36, 1988, pp. 1948-1956.

In addition, prior art balanced passive reflection FET mixers designed for use in high speed technologies at relatively high frequencies typically include directly connected gates as shown in FIGS. 1A and 1B. As shown in FIG. 1A, a prior art quasi-double balanced passive reflection mixer includes switching circuit 15 in series with a local matching circuit 19, local oscillator input circuit 23, RF-to-IF coupling circuit 25, diplexer circuit 29, and bias circuit 35. The mixer circuit also includes RF ports 41 and 47. Switching circuit 15 acts as the LO/RF or LO/IF signal mixer by creating a time varying impedance that varies in response to the applied LO signal.

The switching circuit 15 includes first (Q1) and second (Q2) FET transistors having their gates and sources electrically connected together as shown. The switching circuit 15 is a three port device having an input port for receiving a LO signal through the matching circuit 19 from the local oscillator circuit 23. The LO signal functions to operate the switch and the RF and IF ports 41, 47 through the RF-to-IF (combiner/transformer) circuit 25 and diplexer circuit 29. More particularly, the switching circuit 15 functions as the LO/RF or LO/IF signal mixer by creating a time varying impedance that varies in response to the LO signal. The diplexer circuit functions to filter and separate the IF signals from the RF signals during either up-frequency conversion or down-frequency conversion. In particular, in up-frequency conversion an IF signal is applied to port 47 and an RF signal is extracted at port 41. In down-frequency conversion, an RF signal is applied to port 41 and an IF signal is extracted from port 47. The RF-to-IF circuit 25 functions to prevent LO signals from appearing at the RF and the IF ports. The FET switch 15 is responsible for mixing the local oscillator signal from block 23 with the radio frequency signal coupled to the FET switch through the diplexer circuit 29 and RF-to-IF coupling circuit 25.

FIG. 1B is a simplified circuit diagram of a mixer of the type shown in FIG. 1A in common mode for the LO signal. From FIG. 1B the drain voltage may be shown to have a transition between $V_{D(off)}$ [$V_{D(off)}=V_D$, IN off state condition)] and $V_{D(on)}$ [$V_D-I_D R_D$, IN On state condition] where $V_D$ is supply voltage. The resistor $R_D$ limits the DC current passing through the transistor and thereby serves as a load for the LO signal. In this configuration, a higher drain voltage is needed to achieve required linearity.

Mixers of the type shown in FIGS. 1A and 1B generally suffer from reduced efficiency due to coupling losses and instability due to the high frequency devices. Furthermore, because the circuit topology amplifies the signal from the local oscillator 23, special termination is often needed to achieve good performance. The circuit also typically requires a higher operating DC voltage and consumes a higher current. In addition, isolation of the local oscillator 23 is often poor due to the asymmetry of the circuitry (e.g., sources are grounded and the transformer that typically forms RF-to-IF circuit 25 is connected to load at its center tap).

Of utility then are mixers that improve the high frequency drive level transfer to the mixing cell as well as the low frequency stability, better isolate the local oscillator, and that provide a reduced level of non-linearity and intermodulation distortion.

SUMMARY OF THE INVENTION

An aspect of the present invention is a mixer comprising a first input port for receiving a first input signal from a local oscillator and a mixing cell for combining the first input signal with a second input signal to produce an output signal. Preferably, the mixer also includes first circuitry coupled between the mixing cell and the first input port for shaping the first input signal.

In accordance with this aspect of the present invention, the first input signal preferably comprises one or more pulses and the first circuitry reduces the rise and fall times of at least one of the one or more pulses.

Further in accordance with this aspect of the present invention, the second input signal is preferably at a predetermined frequency and an output signal produced by the mixer is at a frequency less than the predetermined frequency. The second input signal may, however, be at a predetermined frequency while the output signal is at a frequency greater than the predetermined frequency.

Further in accordance with this aspect of the present invention, the mixing cell preferably comprises first and second transistors, each having gate, drain and source terminals, the first circuitry being coupled between the gates of the first and second transistors. Most preferably, the transistor comprises a field effect transistor.

The first circuitry may further desirably comprise a dual-tuned network that resonates a capacitance associated with the gates of the first and second transistors. Further still, the dual-tuned network may comprise a pair of parallel L-C tuned networks, each parallel L-C network being connected to a gate of one of the transistors. In addition, the second input signal may be coupled to the mixing cell through a transformer. Most preferably, the transformer comprises a 0/180 degree transformer.

In another embodiment, the first circuitry may also comprise a pair of parallel R-C networks coupled in series between each gate of the transistors. In this regard, the local oscillator is preferably connected at a point between the pair of parallel R-C networks.

In another aspect, the present invention desirably comprises a mixer. The mixer preferably comprises a first input port for receiving a first input signal from a local oscillator, a second port for connecting to a radio frequency source or sink and a third port for connecting to a intermediate frequency source or sink. The mixer may also preferably comprise switching circuitry coupled to the first input port through a coupling element such that the local oscillator is isolated from the second and third ports.

In accordance with this aspect of the present invention, the coupling element may comprise a transformer. Most preferably, the transformer comprises a transformer balun.

Further in accordance with this aspect of the present invention, the switching circuitry preferably comprises a pair of field effect transistors each having gate, drain and source terminals, and each gate terminal being connected to the transformer. Furthermore, each gate terminal may be connected to the transformer through pulse shaping circuitry. Preferably, the pulse shaping circuitry comprises a pair of parallel R-C networks, each R-C network being connected to each transistor gate.

Further still in accordance with this aspect of the present invention, the switching circuit may comprise a pair of field effect transistors each having gate, drain and source terminals, and each gate terminal being connected to the coupling element. In that regard, the coupling element may comprise a 0/180 degree phase splitter.

Further in accordance with this aspect of the present invention, each gate terminal is coupled to the coupling element through pulse shaping circuitry. The pulse shaping circuitry may also comprise a pair of parallel L-C circuit networks, each L-C network being connected to each transistor gate. In addition, the pair of parallel L-C circuit network preferably operates to tune the gate conductance of the switching network.

In another aspect, the present invention may comprise an information communication apparatus. The apparatus preferably includes means for transmitting or receiving information communicated over a network, said means for transmitting or receiving including a mixer comprising: a first transformer having a first output and a second output, the first output and second output differing in phase by approximately 180 degrees; a pulse shaping network coupled to the first and second outputs; and a mixing cell coupled to the pulse shaping network, the mixing cell comprising at least two FETS whose gate terminals are each coupled to the pulse shaping network.

In accordance with this aspect of the present invention, the gate terminals of the FETs are driven sinusoidally by a signal provided through the first transformer.

Further in accordance with this aspect of the present invention, the apparatus may further comprise a second transformer having a first, a second, a third and a fourth port, the first port providing an RF output signal that differs in phase by approximately 180 degrees from the second port and the third port providing an IF output that substantially matches the phase of the second and fourth ports.

Further still, the apparatus preferably is an electronic device selected from the group consisting of a radio frequency transmitter and a radio frequency receiver. The apparatus may also be an electronic device selected from the group consisting of a cellular phone, a personal digital assistant, a modem, a laptop, a desktop computer, a satellite telephone and a landline telephone.

In addition to the foregoing, an additional aspect of the present invention is a relatively low distortion, high dynamic range reflection mode commutating FET double balanced mixer that desirably provides a low noise figure and high dynamic range without requiring a substantial increase in the local oscillator (LO) drive signals. In an aspect of the present invention, inter-port isolation, which is generally considered inherent in the design of such mixers and caused by signal leakage between the RF and IF ports either the LO and RF or LO and IF ports, is reduced using amplitude and phase cancellation techniques. This generally results in reduced circuit complexity and the need for additional, and typically complex, diplexer or duplexer filtering. A mixer implemented in accordance with the various aspects of the present invention may achieve a third order input intercept point (IIP3) in excess of +40 dBm throughout the frequency bands provided transformer symmetry is maintained and controlled.

In another aspect, the present invention is a balanced passive reflection FET mixers that uses a novel configuration and operates with a reduced level of non-linearity and intermodulation distortion. The mixer desirably provides an improved high dynamic range, low distortion double balanced mixer FET or MESFET based, operating in reflection commutating mode, with the application of a DC bias to the drains of the FETs and a high level signal at the gates of the FETs. The mixer also desirably provides low distortion and high linearity at reduced LO signal drive levels, typically +17 dBm, but can be lower or higher, and is not limited by the drive level. The mixer is also useful for both up and down conversion, handling wide frequency bands having overlapping RF and IF frequencies and either LO and RF or LO and IF frequencies without need for filtering. The mixer can also be advantageously made with lumped element transformers at frequencies at or below the L band and with distributed element (microstrip/stripline/suspended stripline) transformers at frequencies above L band. The mixer can also desirably process high signal level inputs with minimal distortion.

In another aspect, the present invention comprises a relatively low distortion and high dynamic range reflection mode commutating FET double balanced mixer that provides improvement in efficiency and inherent isolation between any two of the three unbalanced ports. The RF and IF ports of the mixer may have overlapping frequencies. In addition, either the LO and RF or LO and IF ports can may also have overlapping frequencies. LO isolation at the non-isolated port is achieved through a filter being low pass, high pass, band pass or band reject. The mixer preferably achieves inherent isolation through a transformer used as a 4-port, 0/180 degree phase splitting transformer having two 50 ohms ports (sigma and delta) and two higher impedance ports that are in-phase with the sigma port and 180 degrees out-of-phase with the delta port. The IF and RF output ports are taken from either the sigma or delta ports. The LO signal is fed through a transformer for complementary (0/180 degree phase splitter) phase to the gates of the FETs, so that one FET or FET network is conducting (ON) while the other FET or FET network is non-conducting (OFF). A filter may be used at either the sum or sigma ports or both, depending on the isolation desired.

In another aspect, a parallel LC tuned circuit network provided as part of a slope shaping circuitry improves the rate of energy transfer of the LO drive signal in the given cycle, thereby reducing the non-linearity produced in the mixing cell due to FET ON resistance.

In another aspect, a series tuned network (as part of the FET structure, presented across the gate and source, formed by the lead inductance and dynamic drive dependent gate-source capacitance) in conjunction with the external parallel LC network minimizes the rise and fall times of the LO input signal.

In yet another aspect, if the parallel LC-tuned and series tuned networks are used, the LO input signal is enhanced so that the efficiency of the mixer improves significantly, thereby maintaining the 1 dB compression point with reduced LO signal levels.

In another aspect, the present invention is a field effect transistor mixer preferably comprising a first port where the local oscillator (LO) input signal is split into complementary mode (0/180 degrees) by the LO input transformer of transformation ratio 4, and may vary depending upon the bandwidth and level of energy transformation (preferably with impedance transformation of 50 ohms to 200 ohms) and AC coupled through coupling capacitors to the gates of at least two FETs or FET networks so that the FETs or FET network operate in complementary mode. Each of the FETs or FET network preferably have their source grounded and the drains connected to the higher impedance ports of the 0/180 degree LO transformer. In accordance with this aspect of the present invention, this circuit configuration amplifies the LO signal and shapes it into a rectangular pulse (preferably 50% duty cycle). The fast rising and falling edges of the shaped LO signal forces the FETs to switch alternatively into saturation (on) pinch-off (off) as reflective commutation (switch) mode. Further in accordance with this aspect of the present invention, the FETs and FET networks may be a dual FET having a gate, source and drain and the FET network can be two or more FETs connected in parallel in such a way that the gates are connected together, further the drains are also preferably connected together and the sources are grounded. Connecting FETs in parallel in this manner to form said networks reduces the inherent drain to source 'ON' resistance ($r_{ds\text{-}ON}$) in the FETs for lower non-linearities in the FET switches.

Furthermore, the LO input transformer may desirably be a lumped or distributed element, depending on the frequency and bandwidth required for the mixer.

In a further aspect, a mixer implemented in accordance with the present invention can be used in both up and down conversion.

In a further aspect, in a mixer implemented in accordance with the present invention the frequencies may overlap in the RF and IF ports and either LO to RF or LO to IF ports without need for extra filtering. Filtering may be necessary in some circumstances to isolate leakage from the LO into either the RF port or IF port, but not necessarily both.

DETAILED DESCRIPTION

Even though a mixer works by means of an amplitude-nonlinear behavior in the active device(s), it is generally desired (and expected) that the active device(s) operate as a linear frequency shifter. The degree to which the frequency-shifted signal is attenuated or amplified is an important mixer property. In that regard, the linearity performance of a mixer may be evaluated in terms of its third order intercept point ($IP_3$). In addition, conversion gain can be positive or negative; usually by convention, negative conversion gain is often stated as conversion loss.

Figure 2:
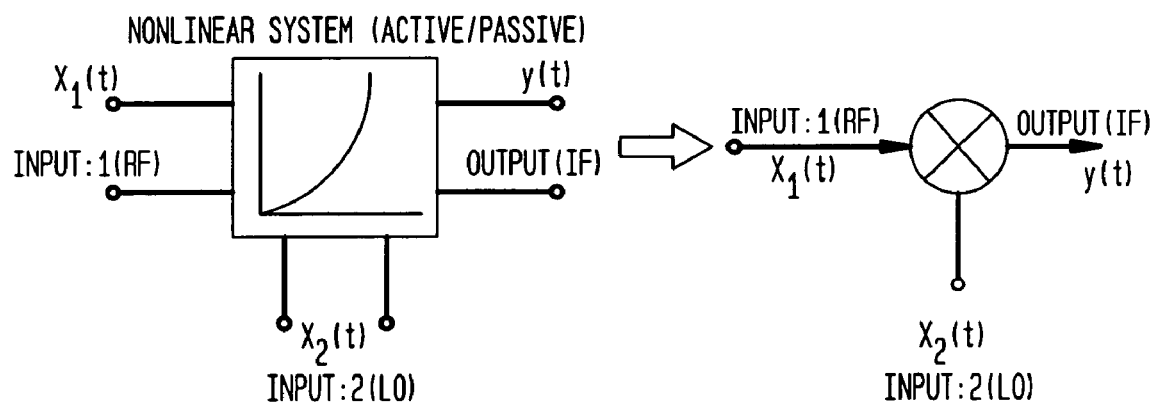
FIG. 2 illustrates a model for a system response for a non-linear network or circuit element.

FIG. 2 shows a model for the system response of a nonlinear network/circuit that is used to establish a relationship between gain compression and an intercept point of a mixer circuit having two inputs, $x_1(t)$ and $x_2(t)$ in accordance with an aspect of the present invention. In FIG. 2, the system response of the nonlinear network/circuit is illustrated with two inputs, an RF (radio frequency) input and a LO (local oscillator) input. Although this model does not include the dynamic effects present in the nonlinear circuits, including such effects would generally make the analysis generally more complex, without appreciably change the result.

The nonlinear transfer characteristics of the system may be described using a power series:

$$y(t) = a_1 x(t) + a_2 x(t)^2 + a_3 x(t)^3 + a_4 x(t)^4 + a_5 x(t)^5 + a_6 x(t)^6 \ldots a_n x(t)^n, \quad (1)$$

where $x(t)$ is the input signal and $y(t)$ is the output signal.

Equation (1) can be rewritten as:

$$y(t) = a_{10} x_1(t) + a_{01} x_2(t) + a_{11} x_1(t) x_2(t) + a_{20} x_1(t)^2 + a_{02} x_2(t)^2 + a_{21} x_1(t)^2 x_2(t) + a_{21} x_1(t) x_2(t)^2 + \ldots, \quad (2)$$

where coefficients $a_{10}$ and $a_{01}$, correspond to the direct coupling of the RF input signal $x_1(t)$ and the LO signal $x_2(t)$ to the intermediate frequency (IF) output $y(t)$, $a_{11}$ represents the conversion gain or loss, and coefficients $a_{ij}$ describe higher order nonlinear behavior.

For the calculation of $IP_3$, a two-tone test signal may applied as:

$$x_1(t) = \alpha \cos \omega_1 t + \beta \cos \omega_2 t \quad (3)$$

and LO signal is given by:

$$x_2(t) = \gamma \cos \omega_3 t \quad (4)$$

In calculating $IP_3$, the third-order non-linearity is generally important. Equation (1) can be described as:

$$y(t) = a_1 x(t) + a_3 x(t)^3 \quad (5)$$

Equation (5) can be rewritten as:

$$y(t) = \left[ a_1 \alpha + \frac{3 a_3 \alpha^3}{4} + \frac{3 a_3 \alpha \beta^2}{2} + \frac{3 a_3 \alpha \gamma^2}{2} \right] \cos \omega_1 t + \left[ a_1 \beta + \frac{3 a_3 \beta^3}{4} + \frac{3 a_3 \beta \alpha^2}{2} + \frac{3 a_3 \beta \gamma^2}{2} \right] \cos \omega_2 t + \left[ a_1 \gamma + \frac{3 a_3 \gamma^3}{4} + \frac{3 a_3 \gamma \beta^2}{2} + \frac{3 a_3 \gamma \alpha^2}{2} \right] \cos \omega_3 t + \left[ \frac{3 a_3 \alpha^3}{4} \cos 3 \omega_1 t + \frac{3 a_3 \beta^3}{4} \cos 3 \omega_2 t + \frac{3 a_3 \gamma^3}{4} \cos 3 \omega_3 t \right] + \quad (6)$$

-continued $$\frac{3a_3\alpha^2\beta}{4}[\cos(2\omega_1 t + \omega_2 t) + \cos(2\omega_1 t - \omega_2 t)] +$$

$$\left[\frac{3a_3\alpha\beta^2}{4}[\cos(2\omega_2 t + \omega_1 t) + \cos(2\omega_2 t - \omega_1 t)]\right] +$$

$$\frac{3a_3\alpha\gamma^2}{4}[\cos(2\omega_3 t + \omega_1 t) + \cos(2\omega_3 t - \omega_1 t)] +$$

$$\left[\frac{3a_3\beta\gamma^2}{4}[\cos(2\omega_3 t + \omega_2 t) + \cos(2\omega_3 t - \omega_2 t)]\right] +$$

$$\frac{3a_3\alpha^2\gamma}{4}[\cos(2\omega_1 t + \omega_3 t) + \cos(2\omega_1 t - \omega_3 t)] +$$

$$\left[\frac{3a_3\gamma\beta^2}{4}[\cos(2\omega_2 t + \omega_3 t) + \cos(2\omega_2 t - \omega_3 t)]\right] +$$

$$3a_3\left[\frac{\alpha\beta\gamma}{4}[\cos(\omega_1 t + \omega_2 t + \omega_3 t) +\right.$$

$$\left.\cos(\omega_1 t + \omega_2 t - \omega_3 t)]\right] + 3a_3\left[\frac{\alpha\beta\gamma}{4}\right.$$

$$\left.[\cos(\omega_1 t - \omega_2 t + \omega_3 t) + \cos(\omega_1 t - \omega_2 t - \omega_3 t)]\right]$$

The $n^{th}$ order intercept point ($IP_n$) is the point where the $n^{th}$-order term as extrapolated from small-signal conditions crosses the extrapolated power of the fundamental. The $n^{th}$ order intercept point is given by:

$$IP_n = P + \frac{\Delta P}{n-1} \quad (7)$$

where, $IP_n$ is the $n^{th}$ order intercept point in units of dBm, P is the power in the fundamental frequency in units of dBm, and $\Delta P$ is the difference between the desired output signal and the undesired $n^{th}$ order output product in dB. P is referred as input power $P_{in}$ if an input $IP_n$ ($IIP_n$) is to be calculated or desired and P is output power ($P_o$) if output $IP_n$ ($OIP_n$) is desired.

Conversion compression is the RF input level above which the RF versus IF output deviates from linearity. Above this level, additional increases in RF input level do not result in equal increase in the output level. The input power level at which the conversion loss increases by 1 dB is called the 1-dB compression point (ICP).

From (6) and (7), the input third order intercept point ($IIP_3$) can be expressed as:

$$[IIP_3]_{DBM} = dB_{20}\left[\left|\sqrt{\frac{a_1}{3a_3}}\right|\right] \quad (9)$$

$$[ICP_{1dB}]_{DBM} = [IIP_3]_{DBM} + dB_{20}\left[\frac{1}{2}\sqrt{1-10^{-\frac{1}{20}}}\right] \quad (10)$$

$$[IIP_3]_{DBM} \cong [ICP_{1dB}]_{DBM} + 15.6 \text{ dB} \quad (11)$$

As previously discussed, for a typical diode double balanced mixer, the 1-dB compression point is 6 dB lower than the LO drive level. In comparison, the passive reflection FET mixer is several dB (typically 6 dB) above the LO drive level. From (9), (10) and (11)—

$$[LO]_{DBM(reflection-FET)} \cong [ICP_{1dB}]_{DBM(reflection-FET)} - 6 \text{ dB} \quad (12)$$

$$[IIP_3]_{DBM(refletion-FET)} \cong [LO]_{DBM(reflection-FET)} + 21.6 \text{ dB} \quad (13)$$

The output third order intercept point is given by:

$$[OIP_3]_{DBM(reflection-FET)} \cong [LO]_{DBM(reflection-FET)} - [\text{Conversion Loss}]_{dB} + 21.6 \text{ dB} \quad (14)$$

Equations (11)-(14) generally provide a good approximation for the general relationship between LO power, $IIP_3$, 1-dB compression point of mixer, and the difference between $IIP_3$ and 1-dB compression point, which is typically 15~20 dB depending upon the device (Diode, FETS, Bipolar) and circuit topology used.

Trade-offs between LO power levels, 1-dB compression, and third order intercept points may be necessary, even in multiple diode schemes attempting to improve isolation, bandwidth, and single-tone intermodulation levels. Low distortion mixing is usually possible with small amounts of LO power when an unbiased channel of FETs is used as the mixing element.

As a 50% duty cycle square wave signal drive with fast rise and fall time is usually difficult to achieve, the gate capacitances may be resonated by a dual-tuned network (series and parallel tuned network), and the gates of FETs may be driven sinusoidally. This typically leads to improvement in energy transfer to the mixing cell, and at the same time increases the slope of the LO level used for switching the FET network. The resulting signal-to-distortion ratio (SDR) appearing in the FETs due to the switching mechanism can be described by:

$$SDR \cong 20\log\left[\frac{s}{v_{in}f_{in}}\right] - 4 \text{ dB} \quad (15)$$

$$s = \left[\frac{v_g}{t}\right]_{t=t_r,t_f} \quad (16)$$

The slope of the gate voltage swing, S, is related to $f_{in}$, the input frequency, $v_g$, the gate voltage signal swing, and $v_{in}$, the input signal voltage. From (16) SDR can be improved by increasing the slope, S. This can be achieved either by increasing the magnitude of the gate voltage signal or reducing the rise/fall time of the gate voltage swing. It is also seen from (16) that the reduction in the magnitude of $v_{in}$ improves the distortion. However, there is a trade-off. The magnitude of $v_{in}$ can be lowered by reducing the gate-source resistance but at the cost of higher conversion loss. In addition, by externally connecting an optimum value of $R_{gs}$ across the gate-source of the FETs the effective magnitude of signal swing across the gate-source of the FETs will reduce, thereby improving the SDR without appreciable increase of the conversion loss. This results in optimization of the impedance level for maximum energy transfer in the given cycle, thereby, improving the third order intermodulation distortion without appreciable increase of the conversion loss.

Figure 3:
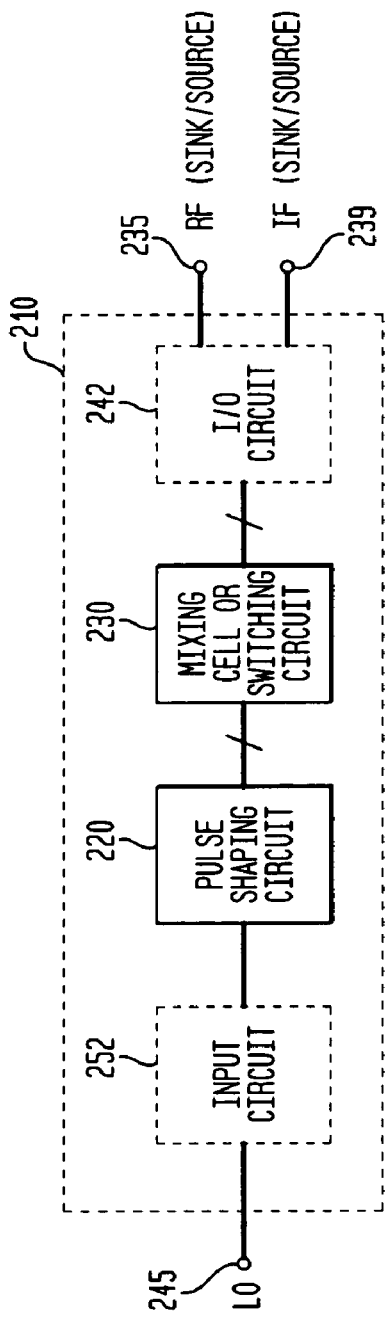
FIG. 3 is a schematic block diagram illustrating a mixer in accordance with an aspect of the present invention.

In view of the foregoing, an aspect of the present invention is the realization that the gates of the FETs that may comprise a switching network or mixing cell need not be connected directly. In general, this desirably allows for the insertion of pulse shaping circuitry between the LO signal input and the mixing cell as shown in FIG. 3. As is shown in FIG. 3, such a mixer 210 comprises pulse shaping circuitry 220 that is coupled to a mixing cell or switching circuit 230. As shown, RF and IF ports 235, 239 serve as sink/source and source/sink terminals. These ports 235, 239 are preferably coupled to the mixing cell 230 through input/output circuitry 242. In addition, the mixer 210 includes a port 245 for connecting to a LO signal. The LO signal may be coupled to the mixing cell 230 through input circuit block 252. This desirably allows for the insertion of a parallel tuned network between the gates of the switching FETS and LO port to improve the SDR (as given in equation (16)), thereby allowing for maximum energy transfer in a given cycle, which provides for optimum low frequency stability. Thus, there is a trade-off between low conversion loss and intermodulation distortion. However, the gate-to-source resistance may be selected for optimum conversion loss and improved IMD (intermodulation distortion). For example this aspect of the present invention may be realized as a double balanced passive reflection FET mixer that operates with a reduced level of nonlinearity and intermodulation distortion. The double balanced configuration cancels the strong second-order nonlinearity of the FET current-voltage (I-V) characteristic, but does not minimize the third-order nonlinearity. Moreover, the inadequate swing and finite slope of the gate voltage (LO signal) give rise to a dynamic nonlinearity that further increases third-order distortion.

Additional examples of mixer circuitry embodying this aspect of the present invention are discussed in detail below. Before discussing such circuitry, we turn to FIG. 4 to discuss an additional aspect of the present invention.

Figure 4A:
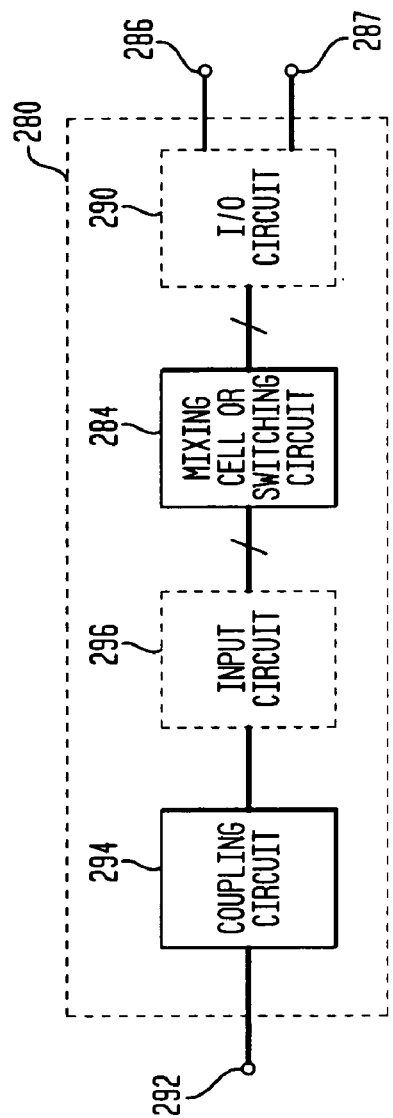
FIG. 4A illustrates a schematic block diagram of a mixer in accordance with an aspect of the present invention.
Figure 4B:
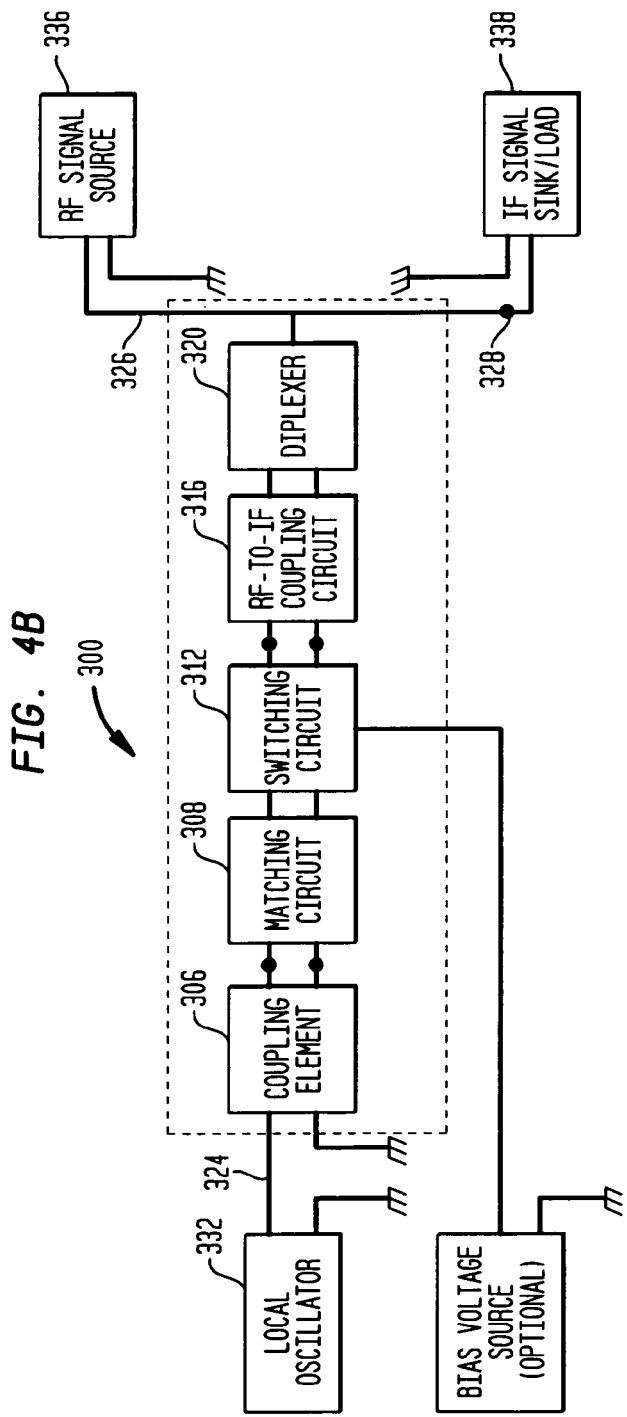
FIG. 4B illustrates a circuit diagram of a mixer in accordance with an aspect of the present invention.

In particular, FIG. 4A is a schematic block diagram of a mixer 280 in accordance with an additional aspect of the present invention. As shown, the mixer 280 comprises a mixing cell 284 that is coupled to RF and IF ports 286, 287 through input/output circuitry 290. The mixing cell 284 is also coupled to a LO signal port 292 through a coupling block 294 and additional LO input circuit 296. In accordance with this aspect of the present invention, the performance of the mixer 280 may be improved by better isolating the local oscillator (LO) from the RF and IF ports 286, 287 through provision of coupling circuit 294. FIG. 4B shows a circuit topology in accordance with this aspect of the present invention. The mixer 300 of FIG. 4B comprises a coupling element or circuitry 306, a matching or input circuit 308, a switching circuit 312, an RF-to-IF coupling circuit 316 and a diplexer 320 which preferably comprise I/O circuit 290. The mixer 300 also includes three ports, 324, 326 and 328 which may comprise ports 245, 235 and 239, respectively. A local oscillator source 332 is connected to the mixer at port 324, while RF sink/source 336 and IF sink/source 338 are connected to ports 326 and 328, respectively. A bias-voltage source 342 is also connected to the switching circuit 312.

Figure 4C:
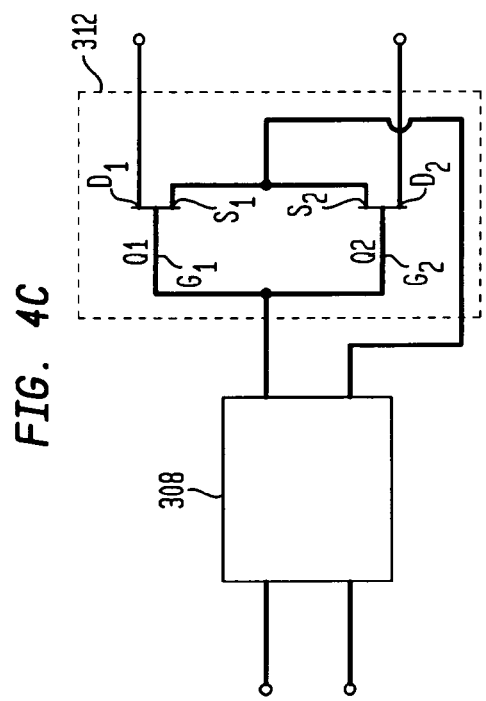
FIG. 4C illustrates an arrangement of the mixing cell of FIG. 4B.

As shown, the local oscillator 324 is connected to the mixer via the coupling element 306. The coupling element 306 preferably comprises a transformer, such as, for example, a transmission line balun. The coupling element 306 is connected to the switching circuit 312 through matching circuit 308. The switching circuit 312 preferably includes a pair of FETS arranged and connected to the matching circuit 308 as shown in FIG. 4C. In particular, the matching circuit 308 is connected across the gate and source terminals of each of the FETS (Q1 and Q2). The FETS may comprise a GaAs MESFET MMIC device mounted in a plastic package, e.g., SO T343. As best seen in FIG. 4B, the local oscillator source 332 may be isolated from the switching circuit 308 and RF and IF ports 326, 328 by not grounding the matching circuit 308. Instead, the matching circuit 308 is connected to the coupling element 306, which is then connected to ground. This topology prevents amplification of the LO signal, and has an improved DC operating point due to placement of the coupling element at the LO signal input. In that regard, the mixer 300 operates at a lower DC voltage and current, thereby improving LO isolation due to true differential operation, i.e., sources are not grounded and no load is necessary.

In general, the LO signal functions to operate the switching circuit 312 and ports 326 and 328, which are respectively coupled to the RF-to-IF coupling circuit 316 through diplexer 320. The RF-to-IF coupling circuit 316 preferably comprises a transformer balun and functions to prevent LO signals from appearing at the RF and IF ports, 326, 328. The RF-to-IF coupling circuit also functions to transform the RF and IF signal IF signal impedance. The switching circuit 312 turns ON and OFF at the frequency of the LO signal, which results in a time-varying change in resistance of the switching elements, e.g., FETs Q1 and Q2 in FIG. 4C, that may comprise switching circuit 312. The diplexer circuit 320 operates to filter the IF and RF signals as is known in the art during up-frequency and down-frequency conversion. During up-frequency conversion input energy is injected into port 328 and an RF signal is extracted from port 326. During down-frequency conversion input energy is injected into port 326 and an IF signal is extracted from port 328.

Figure 5:
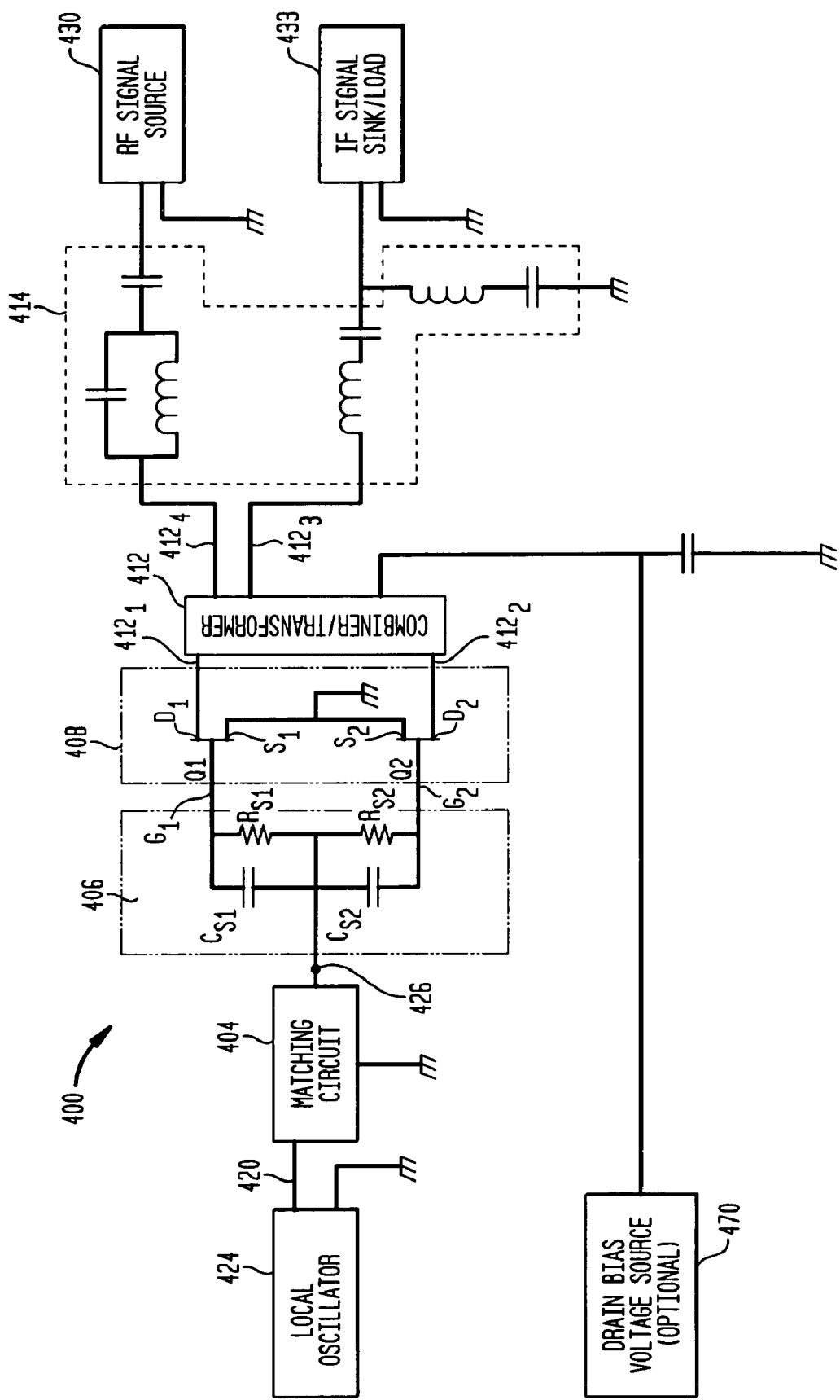
FIG. 5 illustrates a circuit diagram of a mixer in accordance with an aspect of the present invention.

Turning now to FIG. 5, there is shown a schematic of a mixer 400. As was previously discussed with respect to FIG. 3, an aspect of the present invention is the provision of a mixer that includes pulse shaping circuitry between the LO input and the mixing cell. FIG. 5 shows an example of a mixer 400 that may be implemented in accordance with that aspect of the present invention. The mixer 400 includes a matching or input circuit 404, a pulse shaping circuit 406, a mixing cell or switching circuit 408, a RF-to-IF coupling circuit 412 and a diplexer 414.

The matching circuit 404 includes an unbalanced input port 420 for connecting to an external local oscillator signal source 424. The matching circuit also includes an output port 426 for communicating the local oscillator signal to mixing cell 408. The mixing cell 408 is shown comprising a pair of FET transistors Q1 and Q2 each having gate, source and drain terminals (G, S, and D) respectively, although other FET mixing cells are possible. The source terminals are preferably joined together such that the transistors Q1, Q2 are connected in series. As such, a current entering the drain terminal of FET Q1 exits the drain terminal the second FET Q2 and a current entering the drain terminal of FET Q2 exists the drain terminal of FET Q1. The gate terminals are not directly joined together, but instead are connected through a pair of parallel R-C circuits ($R_{S1}$-$C_{S1}$ and $R_{S2}$-$C_{S2}$) that comprise the pulse shaping circuit 406. The local oscillator signal is then coupled to the gate terminals of the FETS Q1, Q2 through respective R-C circuits as shown. The FETs Q1 and Q2 are both either driven ON or OFF at the same time in response to the local oscillator signal that is applied.

As shown, the gate of each FET is driven via a R/C parallel circuit ($R_{S1}$, $C_{S1}$ for $Q_1$; $R_{S2}$, $C_{S2}$ for $Q_2$). $R_{Sx}$ ($R_{S1}$ and $R_{S2}$) preferably provides damping of the gate circuit (reduced quality factor) and also limits the continuous power transfer to the gate allowing higher LO power-levels without destruction of the FET gate. $C_{Sx}$ ($C_{S1}$ and $C_{S2}$) preferably counteracts the limiting effect of $R_{Sx}$ ($R_{S1}$ and $R_{S2}$) for the rising and falling edges of the LO signal. Hence, $C_{Sx}$ ($C_{S1}$ and $C_{S2}$) will drive $Q_x$ ($Q_1$ and $Q_2$) to switch faster, thereby preferably increasing the mixing efficiency and improving the intermodulation (IM) performance.

The coupling network 412 includes a primary port that interfaces with the pulse shaping circuit 406 at terminals $412_1$, and $412_2$ and secondary port that interfaces with the diplexer circuit 414 at a third terminal $412_3$. The coupling network 412 may comprise a transmission line balun that include first and second transmission line components connected to divide the voltage of an incident wave traveling at the primary port equally between the terminals $412_1$, $412_2$, and to sum the currents of traveling waves generated by the first and second transmission line components to generate an exitant traveling wave at the third terminal 412₃. The third terminal 412₃ is connected to a first terminal of the diplexer circuit, while a fourth terminal 412₄ of the coupling network 412 is connected to a second terminal of the diplexer circuit.

The mixer circuitry 400 may also include a bias circuit 470 coupled to an external bias source for providing a direct current bias to the drains of the first and second FET transistors so that a direct current circuit path is defined between the bias source, the coupling network, the FET transistor drain terminals, and the FET transistor source terminals. The first and second FET transistors may each comprise a GaAs MESFET MMIC device mounted in a plastic package (SO T343). Further, the local oscillator input circuit 404 preferably comprises a parallel combination of an inductor and a capacitor. The components and lumped circuit elements of the mixer 400 may be chosen so that it operates in the frequency range of 100 kHz to 1000 MHz (1 GHz).

Figure 6:
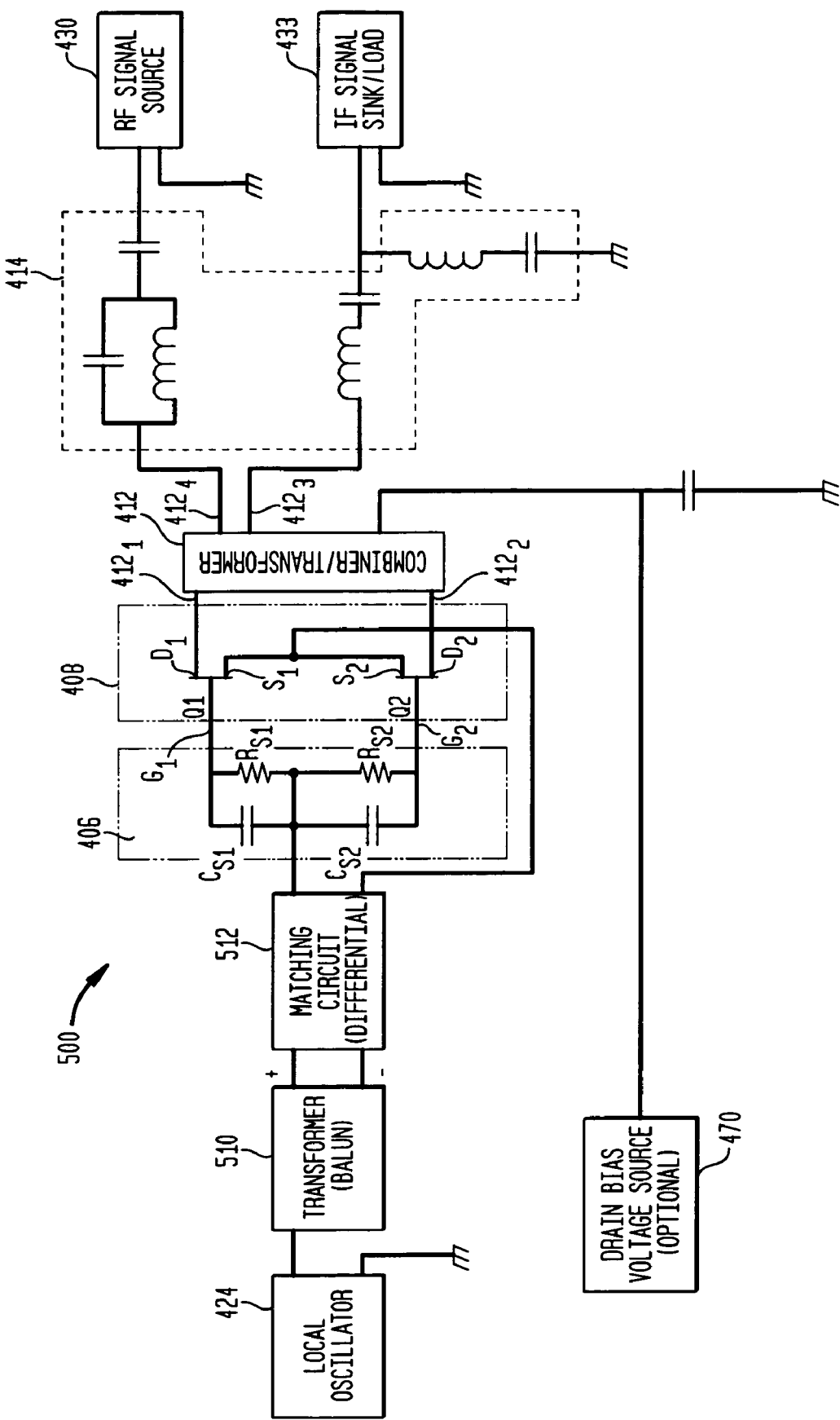
FIG. 6 illustrates a circuit diagram of a mixer in accordance with an aspect of the present invention.

Turning now to FIG. 6, there is shown a variant of the circuit of FIG. 5. The mixer 500 includes as an additional element a transformer 510 coupled between a matching circuit 512 and local oscillator 424. The matching circuit 512 comprises a four port device having four terminals. In addition, whereas the source terminals of the FETS, Q1, Q2, were grounded in FIG. 5, they are connected to a terminal of the matching circuit 512. FIG. 6 shows a single balanced mixer 500 with improved linearity, LO-isolation, and efficiency. This circuit shows another aspect of the present invention, where the operating point is determined not only due to a DC biasing voltage but also due to the amplitude of the LO signal. As shown in the FIG. 6, the transformer (balun) 510 provides isolation of the common sources of the both FETs to the ground for the LO signal, and also supports impedance transformation for improved matching. The transformer 510 (balun: balanced-unbalanced) may include a wire winded transformer with or without magnetic core, a multi-layer planar transformer or coaxial line based transformer. In addition, this topology provides additional impedance transformation for improved LO return loss. In accordance with FIG. 6, the combiner/transformer block 412 may be a simple wire wounded balun transformer with or without a magnetic core, wire wounded impedance transformer or coaxial transmission line transformer. No additional LO load is required for the circuit operation. In accordance with this aspect of the present invention, a transformer (balun) is introduced between the unbalanced LO input and the balanced input of the mixer (between the gates and sources of the FETs), thereby preferably improving the LO isolation due to differential mode operation. In addition, the DC efficiency may also be improved by optimizing the operation point and reducing, if not eliminating, the LO amplification.

In addition, the RF signal is reflected by each of the FET transistors (Q1 and Q2) without a phase shift when the FETs are non-conducting (Off-state), and reflected by each of the FET transistors (Q1 and Q2) with a 180-degree phase shift when the FETs are conducting (On-state) owing to the different relative impedances. A diplexer circuit separates an intermediate frequency signal from the excitant traveling wave signal. The RF signal incident on the first and second FET transistors $Q_x$ (Q1 and Q2) is reflected from the FET transistors $Q_x$ (Q1 and Q2) during the ON and OFF conduction state such that commutation of the RF signal during each half cycle of the local oscillator signal is symmetrical, thereby, RF reflected signal components in the reflected wave are canceled from the extant traveling wave to generate the intermediate frequency (IF) signal.

Figure 1A:
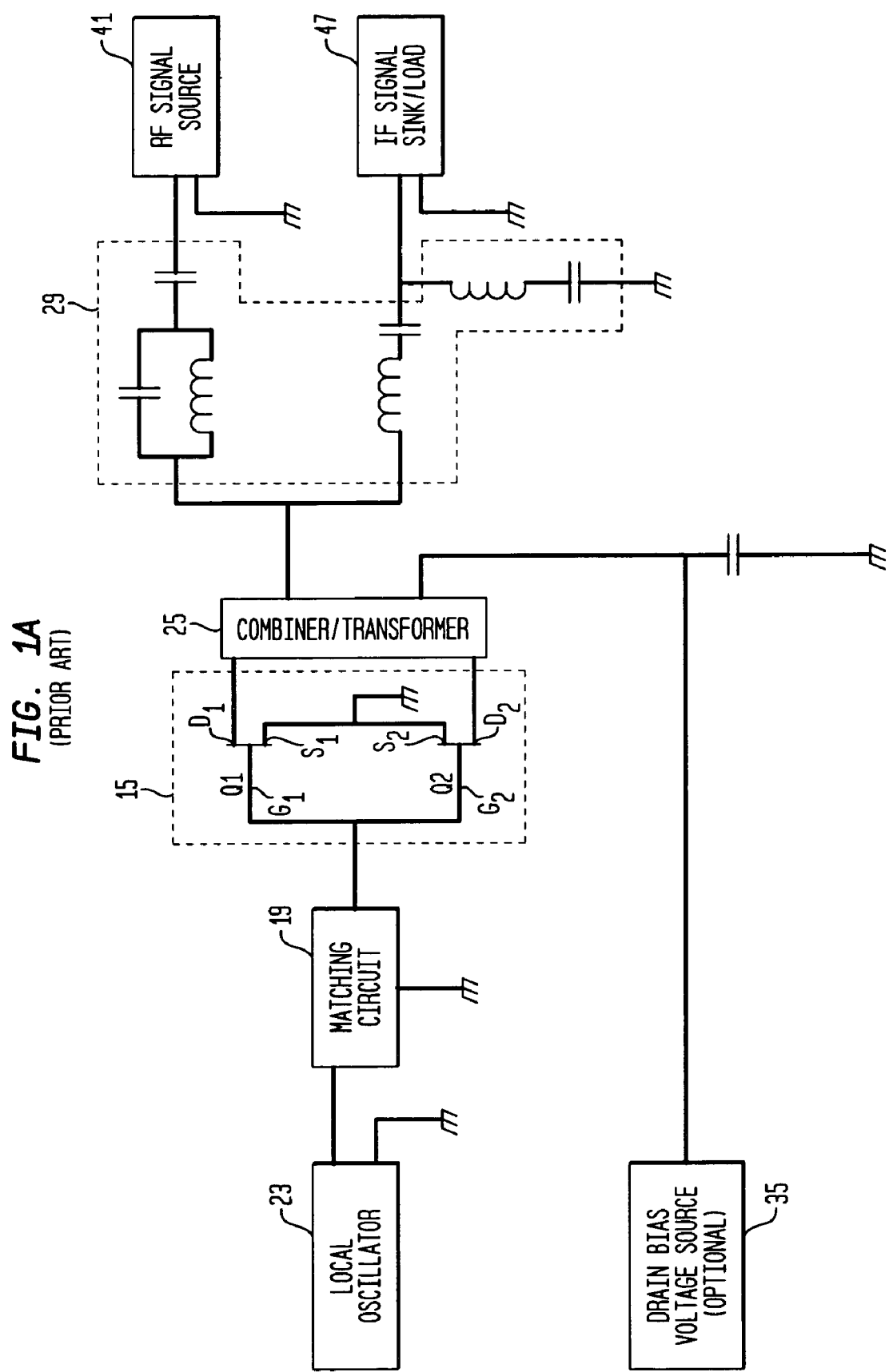
FIGS. 1A and 1B illustrate embodiments of prior art mixers.
Figure 1B:
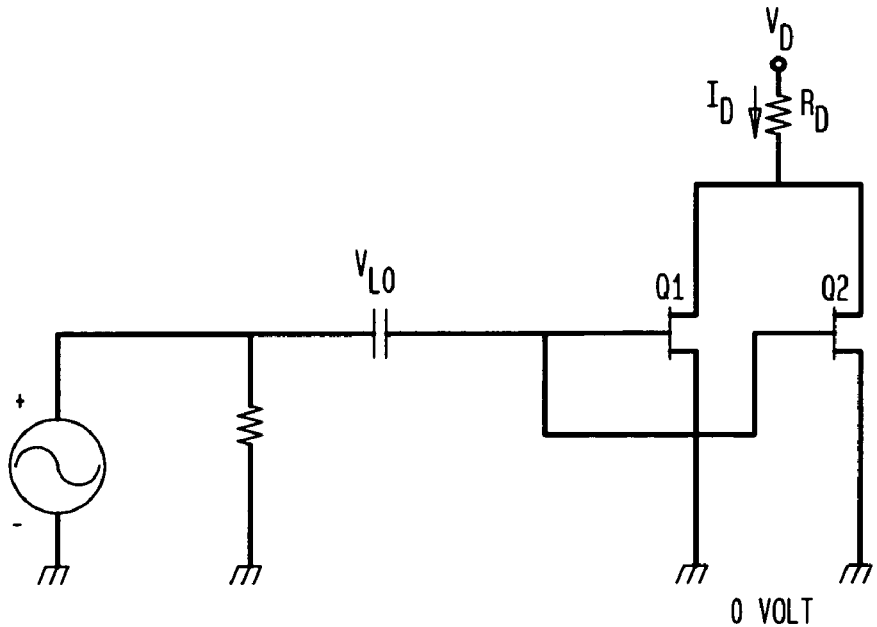
Figure 7:
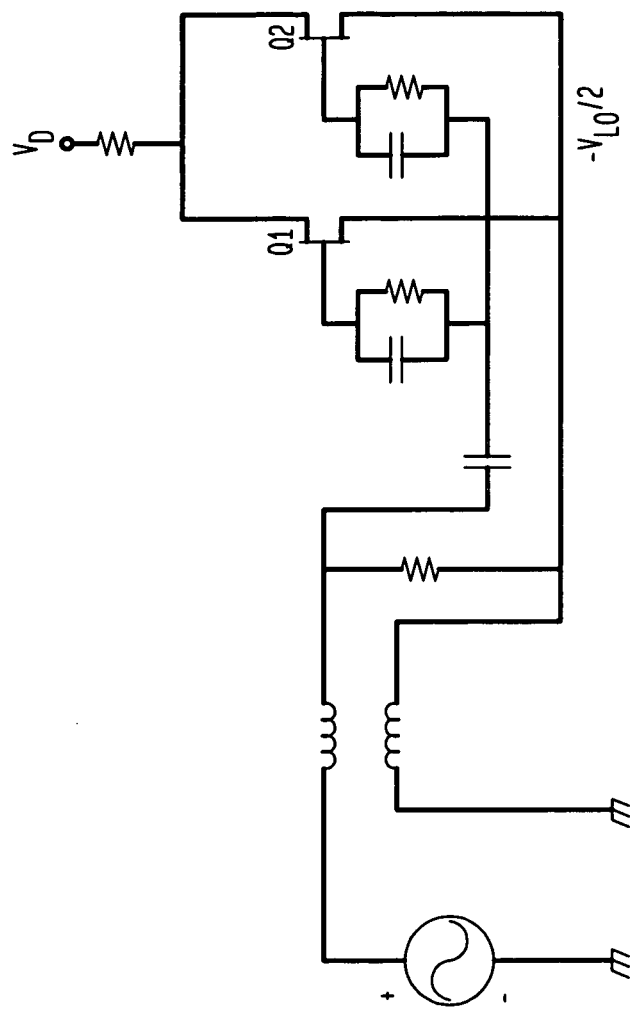
FIG. 7 illustrates a simplified circuit diagram of a mixer in accordance with an aspect of the present invention.

FIG. 7 illustrates a simplified circuit diagram of a mixer circuit in common mode for a LO-signal in accordance with FIG. 6. In this approach, the shortcomings of the prior art are overcome by providing half of the LO voltage with reference to the ground $V_{LO}/2$, therefore the voltage swing lies between $V_D\text{-}V_{LO}/2$ IN Off state, and $[V_{D(on)}+V_{LO}/2]$ in ON state. Thus, the circuit preferably uses a lower $V_D$ to achieve the same linearity as compared to the prior art circuitry of FIG. 1B for example.

Figure 8:
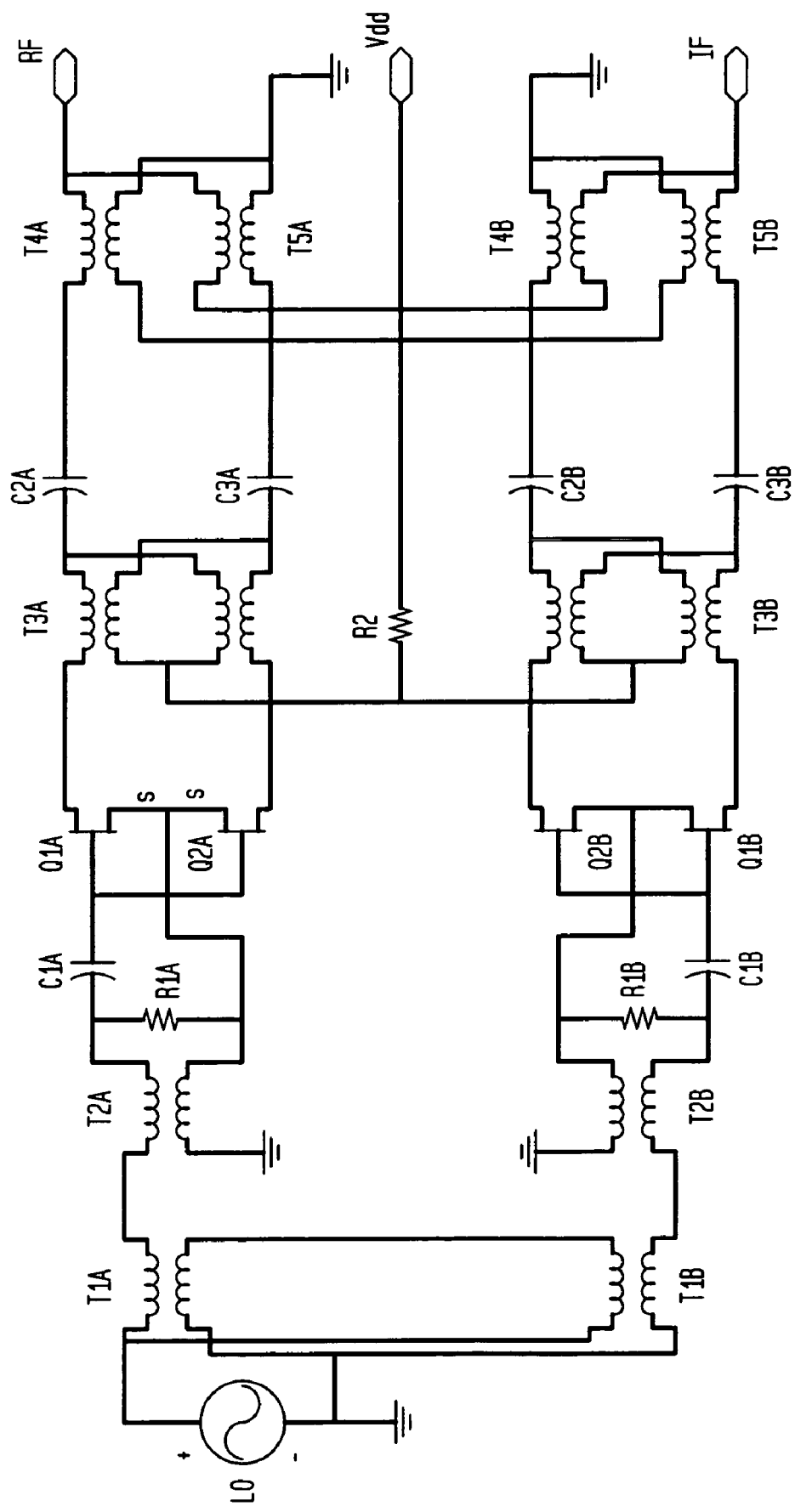
FIG. 8 illustrates a circuit diagram of a mixer in accordance with an aspect of the present invention.

FIG. 8 illustrates a further aspect of the present invention that extends the approach of FIG. 6 to a triple balanced mixer 700 that improves linearity, isolation and efficiency for double and triple balanced passive FET mixer. As may be appreciated from the foregoing discussions, the coupling element in FIG. 8 comprises a transformer illustrated as T1 and T2. The pulse shaping network comprises a pair of R-C networks that are connected to the coupling transformer and the mixing cell. The mixing cell comprises a quad-FET arrangement, which is connected to the RF-to-IF coupling circuit formed by transformer T3. The diplexer is formed by the capacitive elements C2 and C3 and transformers T4 and T5. As shown, a drain supply voltage is coupled to the FETs through the RF-to-IF coupling circuit.

Figure 9:
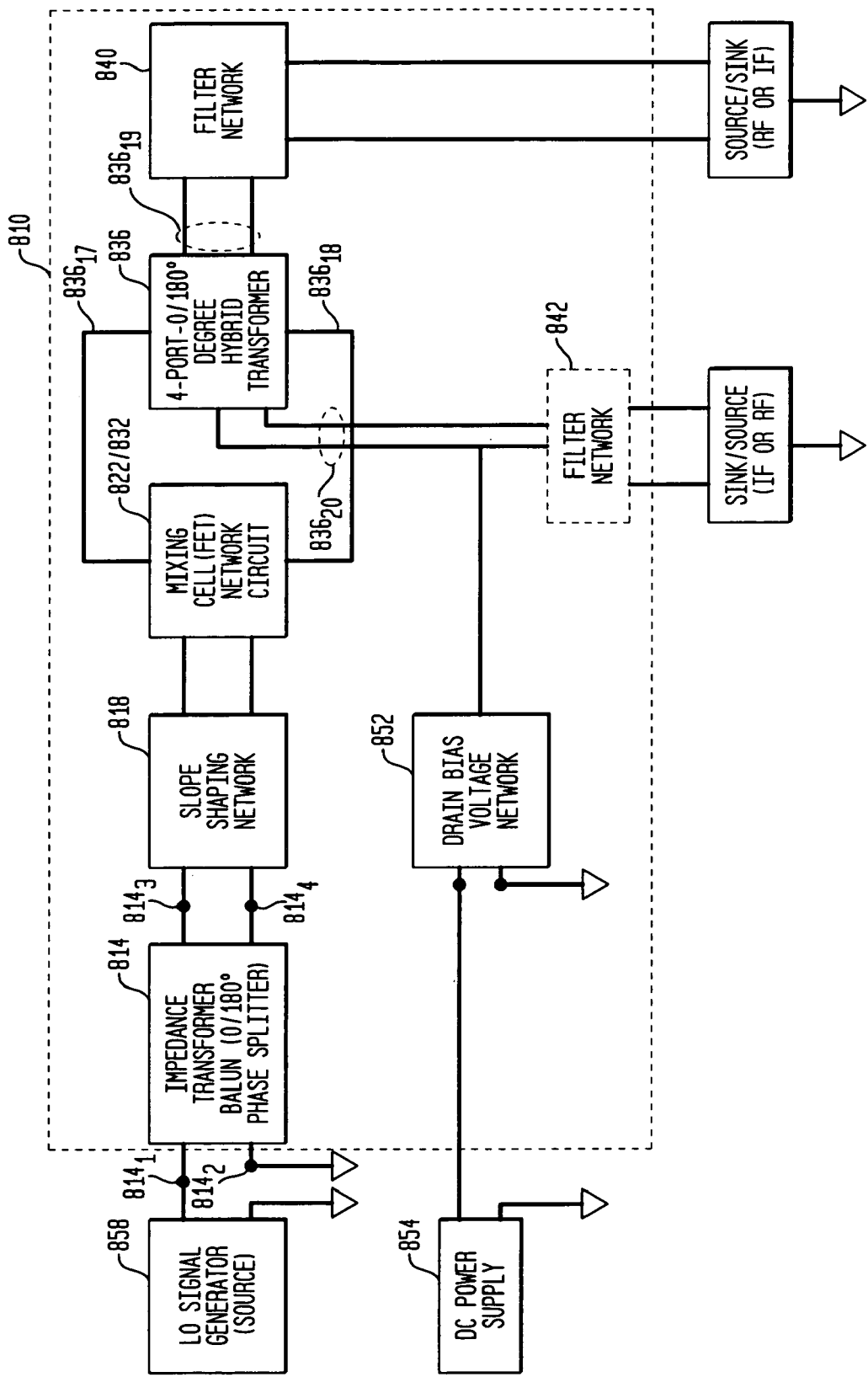
FIG. 9 illustrates a circuit diagram of a mixer in accordance with an aspect of the present invention.

Turning now to FIG. 9, there is shown a block diagram of a double balanced mixer 810 in accordance with an aspect of the present invention. The mixer 810 is yet another example of the mixer discussed above in relation to FIGS. 2 and 3. As shown, the mixer includes a coupling network 814, a pulse/slope shaping network or circuitry 818, a mixing cell or switching circuit 822 (or 832) and a hybrid transformer 836. Preferably, the hybrid transformer 836 includes four ports, 836₁₇, 836₁₈, 836₁₉ and 836₂₀. The mixer 810 may also optionally include first and second filter networks 840, 842 and preferably includes a drain bias voltage network 852, which, as shown, supplies a drain bias voltage from DC power supply 854 to the mixing cell 822/832 through the hybrid transformer 836.

As seen in FIG. 9, a local oscillator (LO) signal is supplied from a source 858 and applied to the input 814₁ of the unbalanced-to-balanced transformer 814. The transformer 814 has two outputs (814₃, 814₄) that differ in phase by approximately 180 degrees. These two outputs are coupled to the mixing cell or switching circuit 822 (or 832 as is explained below) by a pulse shaping network 818. In a variant, transformer 814 may be connected to the pulse shaping network 818 by two coupling capacitors in combination with a pair of shunt resistors that serve to DC block the gate voltage. The drain bias voltage circuit 852 supplies the drains of the switching circuit, which converts the FETs or transistors that preferably comprise the switching network 822/832 into amplifiers for the LO signal. When amplified, the LO signal becomes a square wave (clipped sinusoidal wave) with relatively fast rise and fall times making the switching circuit 822/832 into fast impedance varying switches to the RF input signal.

RF and IF ports are formed at the 4-port 0/180 degree transformer 836, where the RF or IF ports can be formed from either a delta port 836₁₉ or from a sum (or sigma) port 83620₂₀. The RF signal is split between the output ports C 836₁₇ and D 836₁₈ and reflected forming a time varying impedance that changes polarity with the applied LO signal. The resulting IF signal combines at the delta port 836₁₉ or sigma port, 836₂₀, depending on which port is used as the RF input. A filter network 840 or 842, or both filter networks, may be coupled to the port which is not isolated from the LO to reduce the LO leakage and for improved LO to IF and LO to RF isolation.

The filter at the sigma and delta ports of the mixer can be a low pass, high pass, band pass and band reject type filter. The 4-port 0/180 degree hybrid transformer 836 may desirably comprise a typical Guannella type transformer, which supports ultra wideband performance (multi-decade bandwidth), and includes inherent isolation between the sigma and delta ports and isolation between the C and D ports. Preferably, C and D ports are usually 200 ohms where the Sigma and Delta ports are at 50 ohms. In-phase signals applied at C and D ports from the drains of the FETs of said mixer combine at the sigma port and cancel at the delta port. Conversely, out of phase signals applied at the C and D ports cancel at the sigma port and add at the delta port. Signals applied as input at the delta port split, 3 dB down at C and D ports in 180 degrees phase split. Signals applied as input into the sum port split, 3 dB down at C and D ports in zero degrees phase split.

Figure 10:
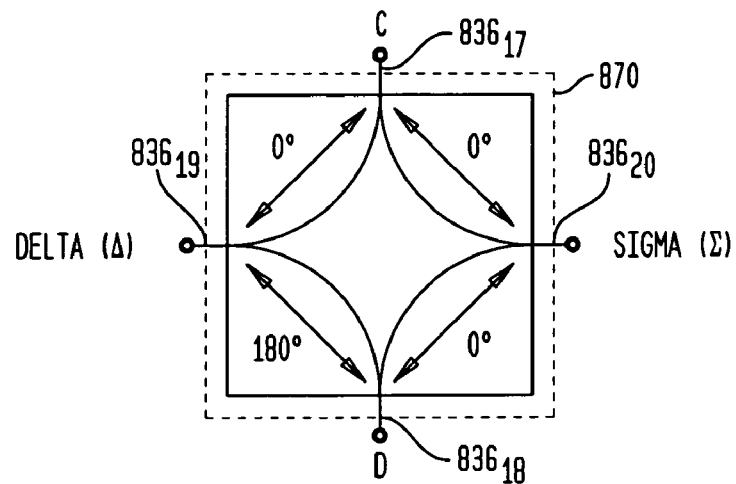
FIG. 10 is a block diagram illustrating a 0/180 degree hybrid transformer in accordance with an aspect of the present invention.

FIG. 10 shows a block diagram representation of a 4-port 0/180 degree hybrid transformer 870 having four distinctive unbalanced ports in accordance with an additional aspect of the present invention. The diagram shows the phase relationship between these four distinctive ports that form the RF and IF ports at the sigma $836_{20}$ and delta $836_{19}$ ports, while ports C $836_{17}$ and D $836_{18}$ are outputs to the RF signal input and inputs for the combined converted IF signal output.

Figure 11:
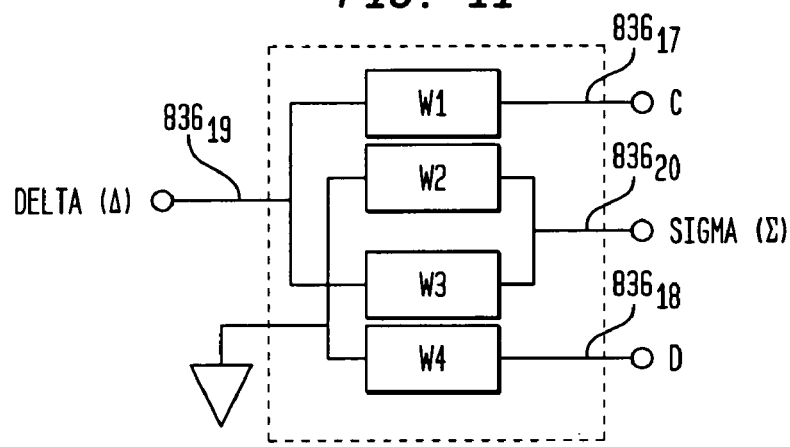
FIG. 11 illustrates a circuit diagram of a 0/180 degree hybrid transformer in accordance with an aspect of the present invention.

FIG. 11 illustrates a wiring diagram of the 4-port network 0/180 degree hybrid transformer 872 in accordance with an additional aspect of the present invention. Input at the sigma port will cancel at the delta port and vice versa, due to the phasing relationship described above thereby providing isolation between these two ports. The circuits of FIG. 10 (870) and FIG. 11 (872) may be realized using lumped and distributed elements or components. In that regard, in FIGS. 10 and 11 each block W1 through W4 illustrates the transformer windings. These figures also show the interconnection between the windings that comprise the transformer circuits.

Figure 12:
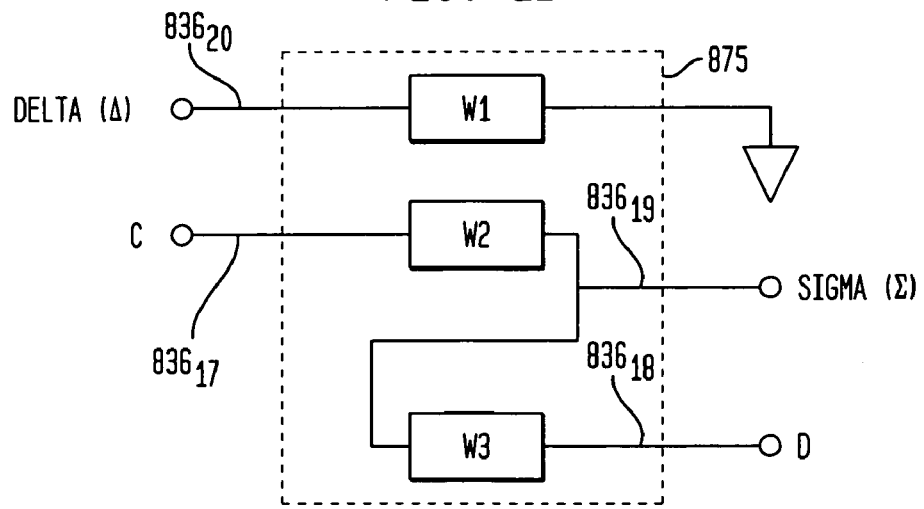
FIG. 12 illustrates a circuit diagram of a 0/180 degree hybrid transformer in accordance with an aspect of the present invention.

FIG. 12 shows another method of achieving the function shown in FIGS. 10 and 11 using a trifilar wire transformer 875. The transformer 875 is not limited to a discrete medium and may be implemented lumped elements. The trifilar transformer 875 is practical for use at frequencies within the VHF range or lower. The C and D ports $836_{17}$ and $836_{18}$, which form the contacts for connection to the drains of the FET switching networks are at the higher impedance side of the transformer and the delta and sigma ports $836_{19}$ and $836_{20}$ are isolated by the phasing and amplitude relationship.

Figure 13:
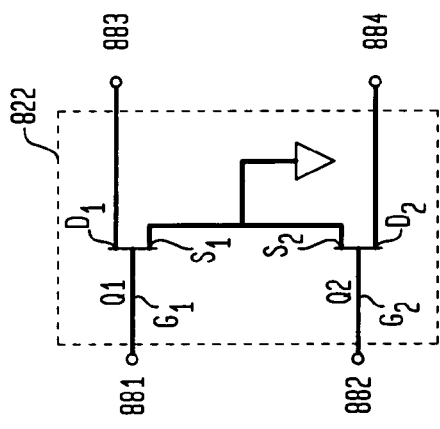
FIG. 13 illustrates a circuit diagram of a switching circuit or mixing cell in accordance with an aspect of the present invention.

The switching network 822/832 may comprise two or more FETs having source, gate and drain terminals. FIG. 13 shows such a network 822 that includes two independent FETs and comprises one possible configuration. The network 822 is connected in such a way that there is access to each gate 881, 882 and each drain 883, 884 terminal. As shown, the sources (S1, S2) are connected to ground and may be made into one common terminal.

Figure 14:
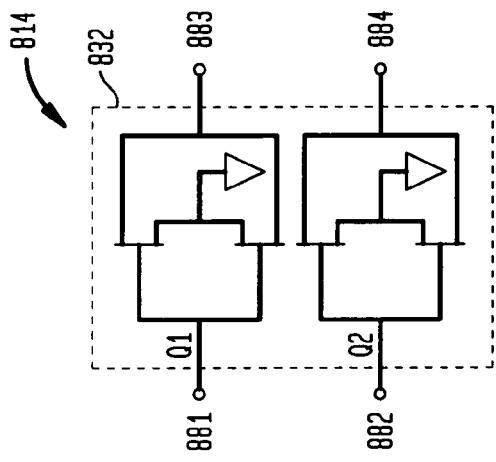
FIG. 14 illustrates a circuit diagram of a switching circuit or mixing cell in accordance with an aspect of the present invention.

FIG. 14 shows a similar connection, but in this case four FETs are used to form a network 832 that generally functions similarly to network 822. In this case, because two or more FETs are connected in parallel, each section includes common gates, common drains and common sources for true paralleling of the FETs. This allows for relatively low resistance in the source to drain channel ($R_{DS}$), when the FETs are operated in the on condition, typically near $I_{DSS}$.

Figure 15:
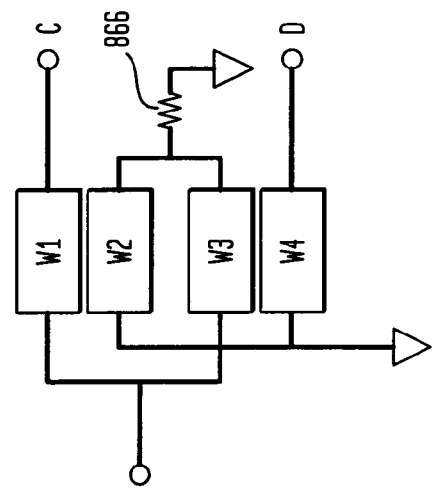
FIG. 15 illustrates a circuit diagram for a transformer in accordance with an aspect of the present invention.

An example of a LO transformer 814 is shown in FIG. 15. The transformer functions as a 0/180 degree phase splitter to control the FET gates (such as those shown in FIGS. 13 and 14) into alternate ON and OFF operation as previously discussed. In addition, by also having impedance transformation, the voltage at the secondary can be made higher if a 50 ohms to 200 ohms transformer is used. This will typically allow the voltage amplitude to be high enough to reach pinch-off ($V_{GS}$ off) and $I_{DSS}$ (saturation current). When biased with a current limited DC voltage at the drains, the mixing cell may also work as an amplifier and limiter to the LO signals resulting in a rectangular pulse signal having a 50% duty cycle. In that regard, the LO signal is transformed to a higher voltage level through impedance transformation, then amplified and further limited by the mixing cell (e.g., a dual-FET network). The amplification and signal limiting function of the mixing cell will typically decrease the rise and fall time of the LO signal, which decreases its zero crossing region and thus improves the switching speed. Decreasing the near zero crossing region of the LO signal is an advantage provided by FET mixers in achieving high linearity performance, when compared to Schottky diode mixers.

Figure 16:
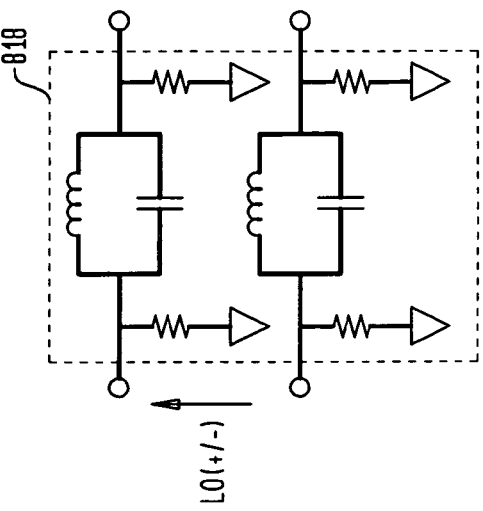
FIG. 16 illustrates a slope shaping network in accordance with an aspect of the present invention.

FIG. 16 illustrates a possible slope shaping network 818. As shown the network 818 comprises a pair of parallel L-C circuit elements, which are inserted in series between the LO transformer and a gate terminal of the mixing cell. The network 818 enhances the slope of the LO signal in conjunction with the series tuned network (as part of the FETs structure presented across the gate and source, formed by the gate lead inductance and dynamic drive dependent gate-source capacitance) for higher efficiency and reduction of non-linearities caused by mixing cells (FET network).

Figure 17:
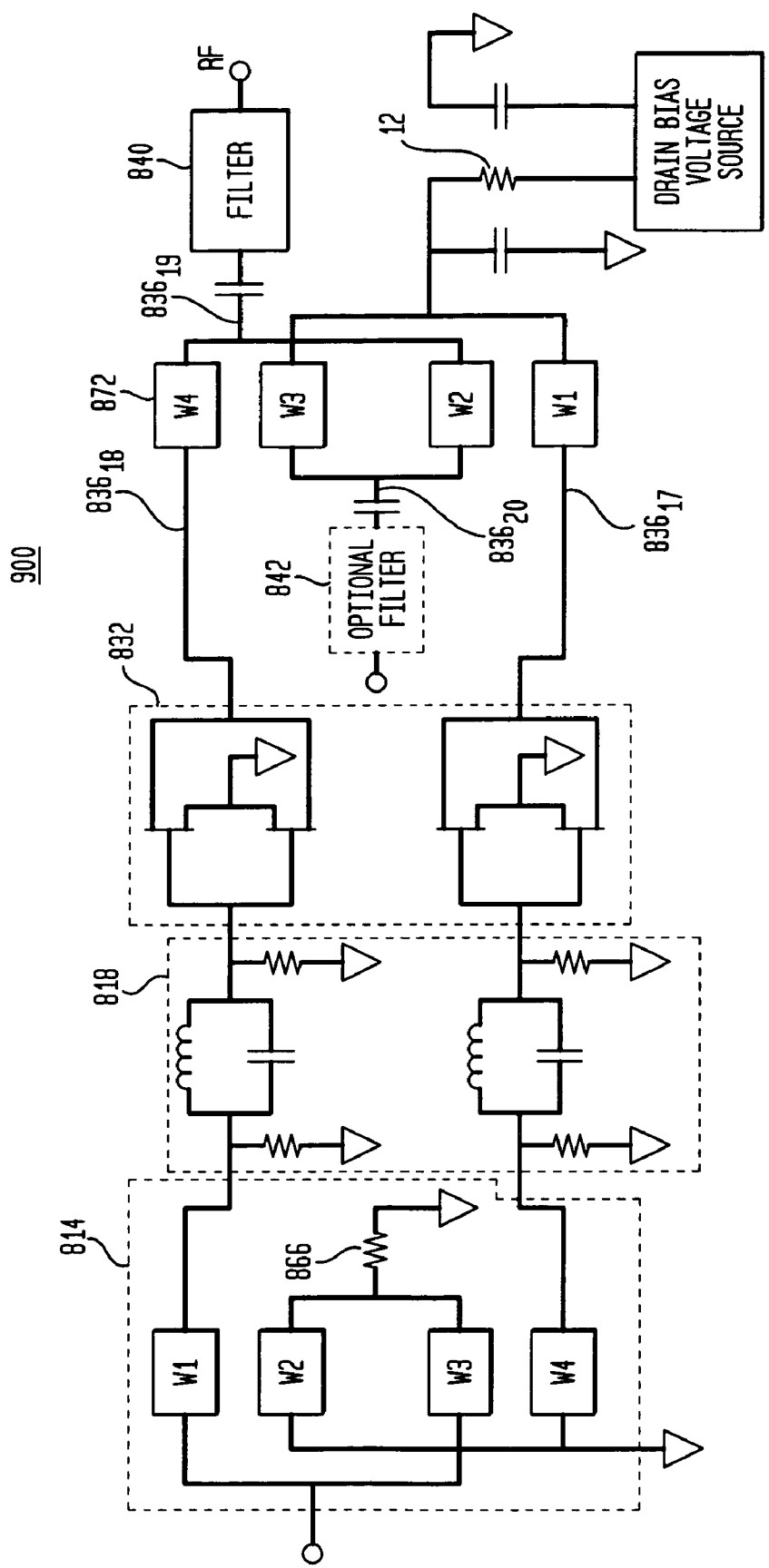
FIG. 17 illustrates a circuit diagram of a mixer in accordance with an aspect of the present invention.

Turning now to FIG. 17, there is shown an example of a mixer 900 in accordance with an aspect of the present invention. The mixer 900 operates as a commutation (switching) reflection mixer. In the mixer 900, the connections between the different blocks to perform the double balanced mixing function and the RF input at the delta port and IF output at the sum port of the 4-port 0/180 degree hybrid are implemented using the circuitry discussed above. The RF and IF ports may be interchanged with no change in signal flow. In this embodiment, the RF to IF ports are isolated and either the LO to RF or LO to IF is isolated, depending on where the RF and IF ports are connected. Therefore, frequencies can overlap in the RF and IF ports and either to LO-RF and LO-IF ports. The RF and IF ports may also be interchanged for flexibility when either the LO-RF or LO-IF frequencies overlap and would be difficult to filter. Voltage reflection of the input signal is in-phase when the FET is in open mode and reflects back out of phase when the switch is in short mode. The two reflected signals form the mixing products combine at the sigma port $836_{20}$ and cancel at the delta port $836_{19}$ when the input signal is fed at the delta port and vice versa. As shown, the mixer 100 may also include an optional filter 842.

For example, where a dual-FET mixer is employed, Q1 and Q2 present a higher impedance than the impedance of the transmission line components coupling the RF signal from the RF signal source 430 to the FET drains when Q1 and Q2 are OFF, and Q1 and Q2 provides lower impedance than the impedance of the transmission line coupling the RF signal to the FET drains when said Q1 and Q2 are ON. The RF signal is preferably substantially completely reflected by each of Q1 and Q2 with no phase shift by Q1 and Q2 when in the OFF state and the signal is substantially completely reflected by each of Q1 and Q2 with 180° phase shift when Q1 and Q2 is in the ON state. In this way, commutation of the RF signal during each half cycle of the local oscillator signal is substantially symmetrical and such that the RF reflected signal components in the reflected wave are substantially canceled from the exitant traveling wave to generate the intermediate-frequency (IF) signal. The coupling network also preferably transforms the an RF input signal from substantially 50 ohms to substantially 200 ohms to thereby yield an improvement in conversion efficiency, and transforms the reflected signal in reflected reverse propagation to substantially 50 ohms.

As discussed above in relation to equation (16), a FET mixer's SDR performance may be improved by increasing the slope of the gate voltage swing (S). This may be achieved by either increasing the slope (increasing the magnitude of the gate voltage signal) or reducing the rise/fall time of the gate voltage swing. Similarly, the distortion performance can be improved by reducing the magnitude of the input voltage signal. This may be achieved by reducing the gate source resistance, although it may also increase the conversion loss. A solution, as described above and discussed in relation to the drawings, is to add the optimum value of resistance across the FET gate and source so that the effective magnitude of the signal swing across the gate and source will be reduced and the SDR will be improved without an appreciable increase in conversion loss. In this way, the gate is optimized in terms of impedance for maximum energy transfer, thereby improving the third -order IMD performance with only a moderate increase in conversion loss.

In addition, a second and a third port where the RF and IF can be interchangeably tapped from the 4-port (0/180 degrees) hybrid transformer is also provided as shown in FIG. 17. These ports may be considered sigma and delta ports. In general, the RF and IF transformer has four active ports labeled sigma, delta, C and D in a manner that signals entering in equal phase and equal amplitude at ports C and D combine at the sigma port and cancel at the delta port and vice versa. Ports C and D are the higher impedance ports, typically 200 ohms and the sigma and delta ports are lower impedance ports, typically 50 ohms, having transmission lines of 100 ohms characteristic impedance. A filter may also be used at either the sigma or delta ports or both ports simultaneously to attenuate the LO signal leakage to the second and third ports as needed. A bias circuit provides direct current (dc) to the in-phase terminal of said RF and IF side 4-port 0/180 degree hybrid and comprising two transformer having bifilar or trifilar windings and current limiting resistors; whereby a dc circuit path is defined between the bias source, the two transformer windings, and the FET transistor drain terminals. Bias decoupling capacitors may be added for additional filtering of leakage through the power supply. The LO, RF and IF ports are AC coupled through coupling capacitors.

The 4-port 0/180 degree hybrid coupler may also be made with trifilar wire having a primary and tapped secondary winding. The primary winding is preferably grounded on one end in unbalanced mode forming the delta port at 50 ohms and the secondary having the center tap forming the sigma port at 50 ohms. Ports C and D are taken from the two outer ends of the secondary winding, typically at 200 ohms.

The LO transformer is preferably a 1:4 (50 ohms to 200 ohms) impedance and phase splitting transformer for increased voltage signal output to drive the FET into full saturation and pinch-off ($I_{DSS}$ and $V_{GS}$ off). The LO transformer may be a Guannella type or a trifilar, secondary tapped 1:4 phase splitting transformer. The transformer is preferably a 1:4 ferrite beads that serves to impede the flow of even mode currents in the transmission lines allowing only odd mode signals to propagate. This mechanism desirably breaks down when the even mode impedance becomes comparable to the source impedance, and is responsible for the lower cut-off frequency about 100 kHz.

The FETs or FET networks are preferably driven in complementary mode by the LO transformer in such manner that one transistor is conducting (ON) while the other is non-conducting (OFF), offering full reflection to the input signal in full short or full open modes. Reflected input signals cancel at either the sum, SIGMA or delta ports, in accordance with the conditions stated. The mixer is therefore double balanced in nature because isolation exists by simple phase and amplitude cancellation in two of the three port combinations. The LO drive signal appearing at the gate is amplified (due to drain source bias) so that voltage appearing at the gates of the switching FET network is large enough to push the FET into cut-off and saturation, thereby, reducing the rise and fall time (zero-crossing) of the LO signal.

Mixers implemented in accordance with the various aspects of the present invention have been shown to work with nominal LO signal levels of +17 dBm, yet while producing high output levels (in terms of the 1-Db compression point) and exhibiting improved linearity (in terms of the third order intercept point). Theses mixers may be designed for various applications, including RF ranges of 700 to 1200 MHz and 1800 to 2200 MHz. For example, a mixer covering the RF range of 1800 to 2200 MHz has been implemented with an LO range of 60 to 200 MHz (at +17 dBm) and an IF range of 1840 to 2275 Mhz. The conversion loss is typically 9.5 dB and usually no higher than 10.5 db. The input third-order intercept point is typically more than +38 dBm while the 1-dB compression point is typically +23 dBm. The LO-to-RF isolation is at least 40 dB and typically 50 dB, the LO-to-IF isolation is at least 40 dB and typically 50 dB, and the RF-to-IF isolation is at least 17 dB and typically 20 dB. This mixer also typically draws less than 50 mA from a single +5 volt DC supply. Mixers implemented in accordance with the various aspects of the present invention may be housed in surface mount packages and have been manufactured by Synergy Microwave Corporation of Paterson, N.J.

A mixer implemented in accordance with the aspects of the present invention may be employed in any number of devices that are used to communicate information, data or signals over telephone, cellular, RF or, in general, communication networks. Such devices, for example, may include but are not limited to a receiver, cellular phones, personal digital assistants, modems, laptops, desktop computers, satellite and landline telephones. In addition, the mixer may be employed in cellular and satellite base stations, or in general, wherever up or down frequency conversion is performed. The mixer may also be employed in wired networks.

The circuit topology and SDR calculations derived in accordance with the various aspects of the present invention is not limited to specific frequency bands, and can be extended to higher frequency bands, by proper choice of medium (lumped or distributed). Further, the present approach for reduction in distortion and higher order nonlinearities is not limited to mixer but valid for amplifier and oscillator depending upon the feedback and other parameters.

Although the invention herein has been described with reference to particular embodiments, it is to be understood that these embodiments are merely illustrative of the principles and applications of the present invention. For example, the mixers described above may be implemented to operate at various RF and IF frequencies, as well as over various frequency ranges, depending on the choice of lumped elements and other components described above. It is therefore to be understood that numerous modifications may be made to the illustrative embodiments and that other arrangements may be devised without departing from the spirit and scope of the present invention as defined by the appended claims.

We claim:

1. A mixer, comprising:
a first input port for receiving a first input signal from a local oscillator;
a mixing cell for combining the first input signal with a second input signal to produce an output signal; and first circuitry coupled between the mixing cell and the first input port for shaping the first input signal, wherein the mixing cell comprises first and second transistors, each having gate, drain and source terminals and wherein the first circuitry comprises a pair of parallel R-C networks coupled in series between each gate of the transistors.

2. The mixer of claim 1, wherein the first input signal comprises one or more pulses and the first circuitry reduces the rise and fall times of at least one of the one or more pulses.

3. The mixer of claim 1, wherein the second input signal is at a predetermined frequency and the output signal is at a frequency less than the predetermined frequency.

4. The mixer of claim 1, wherein when the second input signal is at a predetermined frequency and the output signal is at a frequency greater than the predetermined frequency.

5. The mixer of claim 1, wherein the local oscillator is connected at a point between the pair of parallel R-C networks.

6. The mixer of claim 1, wherein the transistors comprise field effect transistors (FETs).

7. The mixer of claim 1, wherein the second input signal is coupled to the mixing cell through a transformer.

8. The mixer of claim 1, wherein the output signal is coupled from the mixing cell through a transformer.

9. The mixer of claims 7 or 8, wherein the transformer comprises a 0/180 degree transformer.

10. A mixer, comprising:
a first input port for receiving a first input signal from a local oscillator;
a second port for connecting to a radio frequency source or sink;
a third port for connecting to an intermediate frequency source or sink; and
switching circuitry coupled to the first input port through a coupling element such that the local oscillator is isolated from the second and third port, the switching circuitry including a pair of field effect transistors each having gate, drain and source terminals, and each gate terminal being connected to the coupling element, and
wherein each gate terminal is connected to the coupling element through pulse shaping circuitry.

11. The mixer of claim 10, wherein the coupling element comprises a transformer.

12. The mixer of claim 11, wherein the transformer comprises a transformer balun.

13. The mixer of claim 10, wherein the pulse shaping circuitry comprises a pair of parallel R-C networks, each R-C network being connected to each transistor gate.

14. The mixer of claim 10, wherein the coupling element comprises a 0/180 degree phase splitter.

15. The mixer of claim 10, wherein the pulse shaping circuitry comprises a pair of parallel L-C circuit networks, each L-C network being connected to each transistor gate.

16. The mixer of claim 15, wherein the pair of parallel L-C circuit network operate to tune the gate conductance of the switching network.

17. An information communication apparatus, comprising:
means for transmitting or receiving information communicated over a network,
said means for transmitting or receiving including a mixer comprising,
a first transformer having a first output and a second output, the first output and second output differing in phase by approximately 180 degrees;
a pulse shaping network coupled to the first and second outputs;
a mixing cell coupled to the pulse shaping network, the mixing cell comprising at least two FETS whose gate terminals are each coupled to the pulse shaping network, wherein the gate terminals of the FETs are driven sinusoidally by a signal provided through the first transformer; and
a second transformer coupled to the mixing cell, the second transformer having a first, a second, a third and a fourth port, the first port providing an RF output signal that differs in phase by approximately 180 degrees from the second port and the third port providing an IF output that substantially matches the phase of the second and fourth ports.

18. The apparatus of claim 17, wherein the apparatus is an electronic device selected from the group consisting of a radio frequency transmitter and a radio frequency receiver.

19. The apparatus of claim 17, wherein the apparatus is an electronic device selected from the group consisting of a cellular phone, a personal digital assistant, a modem, a laptop, a desktop computer, a satellite telephone and a landline telephone.

20. A mixer, comprising:
a first input port for receiving a first input signal from a local oscillator;
a mixing cell for combining the first input signal with a second input signal to produce an output signal; and
first circuitry coupled between the mixing cell and the first input port for shaping the first input signal,
wherein the mixing cell comprises first and second transistors, each having gate, drain and source terminals and the first circuitry is coupled between the gates of the first and second transistors and
wherein the first circuitry comprises a dual-tuned network that resonates an capaciatance associated with the gates of the first and second transistors, and wherein the dual-tuned network comprises a pair of parallel L-C tuned networks, each parallel L-C network being connected to a gate of one of the transistors.

* * * * *